United States Patent [19]
Dastous

[11] Patent Number: 5,270,958
[45] Date of Patent: Dec. 14, 1993

[54] METHOD AND APPARATUS FOR AUTOMATIC RETURN FROM TEST MODE

[75] Inventor: Susan D. Dastous, Milford, N.H.

[73] Assignee: General Electric Company, Schenectady, N.Y.

[21] Appl. No.: 764,851

[22] Filed: Sep. 24, 1991

[51] Int. Cl.$^5$ .............................................. G04F 1/00
[52] U.S. Cl. .................................. 364/569; 364/483; 364/464.04; 324/74; 324/130; 324/142
[58] Field of Search ................ 364/569, 464.04, 483; 324/74, 130, 142

[56] References Cited

U.S. PATENT DOCUMENTS

| | | | |
|---|---|---|---|
| 4,291,375 | 9/1981 | Wolf | 364/483 |
| 4,335,447 | 6/1982 | Jerrim . | |
| 4,361,877 | 11/1982 | Dyer et al. | 364/900 |
| 4,594,545 | 6/1986 | Germer . | |
| 4,598,248 | 6/1986 | Germer . | |
| 4,987,363 | 1/1991 | Gibbs et al. | 364/483 |
| 5,025,206 | 6/1991 | Germer . | |
| 5,059,896 | 10/1991 | Germer et al. | 364/483 |

FOREIGN PATENT DOCUMENTS 8203482 10/1982 World Int. Prop. O. .......... 324/142

OTHER PUBLICATIONS

Sangamo Energy Management Division, Product Bulletin 10506, ST-Q100 Series, Electronic Meter, Effective Date Jun. 1987.
Sangamo Energy Management Division, Product Bulletin 10251, ST-Q120 Series, Electronic Meter, Effective Date Aug. 1987.
Sangamo Electricity Division, KV1 Multifunction Meter, Product Bulletin 10532, Effective Sep. 1989.
Scientific Columbus, JEM3, Sep. 1989.
Appalachian Technologies Corporation, SSM-SOT Four Quadrant, Time-of-Use Precision Meter, Oct. 1989.
APTECH, Inc., PFM-800 Series Multifunction Meters, Jan. 1991.
Process Systems Incorporated, The Quad 4 Solid State Meter Family, May 1991.
Trans Data, EMS 7000 Electronic Metering Sustem with Demand Register, Publication Date Unknown, this copy obtained on May 14, 1991.
Trans Data, Inc. EMS 96 Electronic Metering System, Publication Date Unknown, this copy obtained on May 14, 1991.
ABB Type E1R Polyphase Solid-State Watthour/Varhour Meter, Sep. 1991.
Schlumberger Industries, Inc. Introducing FULCRUM Commercial/Industrial Meters, Mar. 1991.
Transmission & Distribution, May 1992, Universal Meter Introduced by ABB.
Engineering presentation to AEIC/EEI Meter and Services Committees, Sep. 24, 1990, pp. 1-6.

*Primary Examiner*—Jack B. Harvey
*Assistant Examiner*—Hal D. Wachsman
*Attorney, Agent, or Firm*—Bell, Seltzer, Park & Gibson

[57] ABSTRACT

The apparatus for automatic return from test mode includes a switch or optical port on a meter bezel for initiating, upon user actuation, the storing of customer billing data in a meter register and converting the meter from a customer billing data recording and displaying mode of operation to a test mode of operation for performing one or more field test functions. In addition, to eliminate the likelihood that a customer will be under-billed for unrecorded energy consumption, the meter includes a timer for computing an elapsed period of time (which is programmable in length). Upon the expiration of a predetermined elapsed time, the meter is automatically returned to a customer billing mode of operation, regardless of the state of any test being performed during the test mode. Thus, the possibility that the customer will be under-billed for energy consumed while the meter is accidentally left in the test mode is eliminated.

11 Claims, 2 Drawing Sheets

METHOD AND APPARATUS FOR AUTOMATIC RETURN FROM TEST MODE

BACKGROUND OF THE INVENTION

A. Field of the Invention

The present invention is generally related to meters, and more specifically, relates to automatically returning a meter to normal operations subsequent to performing test operations.

B. Related Art

During the test mode operations of a meter register, the pulses received by the register are not added to a customer's billing data. If the register is inadvertently left in the test mode, the customer may be under-billed. It is desirable, therefore, to provide a method/means to automatically return a meter register to normal billing operations after a pre-determined length of time has passed.

SUMMARY OF THE INVENTION

The present invention is a method and apparatus for automatically returning a meter register to normal billing operations from test mode operations after a programmable length of time has passed. The present invention facilitates reducing potential billing errors in the event that the meter register is inadvertently left in test mode operations.

In one embodiment, the present invention comprises a test mode actuator coupled to a timer and a timer status check mechanism. If the timer "clocks-out", the timer status check mechanism alerts a normal billing operations actuator to cause the register to return to normal billing operation.

BRIEF DESCRIPTION OF THE DRAWINGS

These and other objects of the present invention, together with further features and advantages thereof, will become apparent from the following detailed specification when read together with the accompanying drawings, in which.

DETAILED DESCRIPTION OF THE DRAWINGS

The test mode operation of a meter register typically is initiated by depressing a test mode switch provided on the front panel of a meter register. Field technicians use the test mode operations, for example, to confirm the register's energy calculations, to verify the current interval demand, and to verify the correct watthour constant and interval length.

Upon entering the test mode, billing data that was previously collected is stored away in the meter register memory and is not affected by metering pulses received during the test mode operations. The metering pulses typically are indicative of a pre-determined quantum of energy consumed by a customer. During test mode, however, the meter pulses may be generated for test purposes only.

Figure 1:
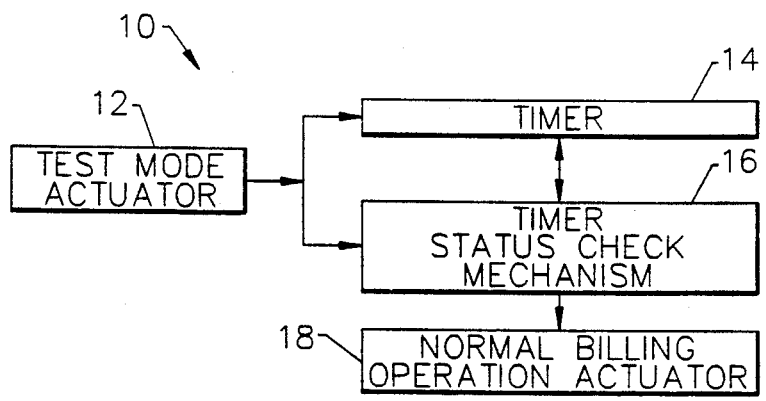
FIG. 1 is a block diagram illustration of one embodiment of the present invention.

One embodiment 10 of the present invention, as illustrated in FIG. 1, comprises a test mode actuator 12 coupled to a timer 14 and a timer status check mechanism 16. Output from the timer status check mechanism 16 is provided to a normal billing operation actuator 18. It is contemplated that each of the foregoing components may be implemented in software or hardware form.

For example, the test mode actuator 12 may be a physical switch mounted so that a field technician may initiate test mode operation simply by depressing the switch. Alternatively, the test mode actuator 12 may be implemented and activated directly by electrical signals which are receivable through a meter interface such an optical port.

It should also be understood that each of the functions shown in FIG. 1 as separate modules may be implemented in software and control operations of a single micro-controller. More particularly, the software controls the micro-controller to be configured to perform the designated operations in a manner well-known in the art.

In a preferred embodiment, the timer 14 is a programmable timer which operates so as to keep track of a pre-determined quantum of time. For example, if the timer is pre-programmed for five (5) minutes, then subsequent to activation of the test mode actuator 12, the timer 14 is monitored by the time status check mechanism 16. Such timers are well-known in the art.

Prior to operations, a system user designates a pre-determined quantum of time for operation of the timer 14. The time value is entered into the timer 14, for example, through an input/output mechanism (not shown) such as through an optical interface as is well known in the art.

Briefly, when a system user desires to enter into test mode operations, the system user actuates the test mode actuator 12 such as by depressing a switch as hereinafter described. A pulse output by the actuator 12 causes the timer 14 to begin tracking time. Once the timer times out after the pre-programmed amount of time has elapsed, the timer status check mechanism 16 detects the time-out condition. The mechanism 16 then outputs a pulse to the normal billing operation actuator 18 which then causes the meter register to switch from test mode to normal billing operations.

Figure 2:
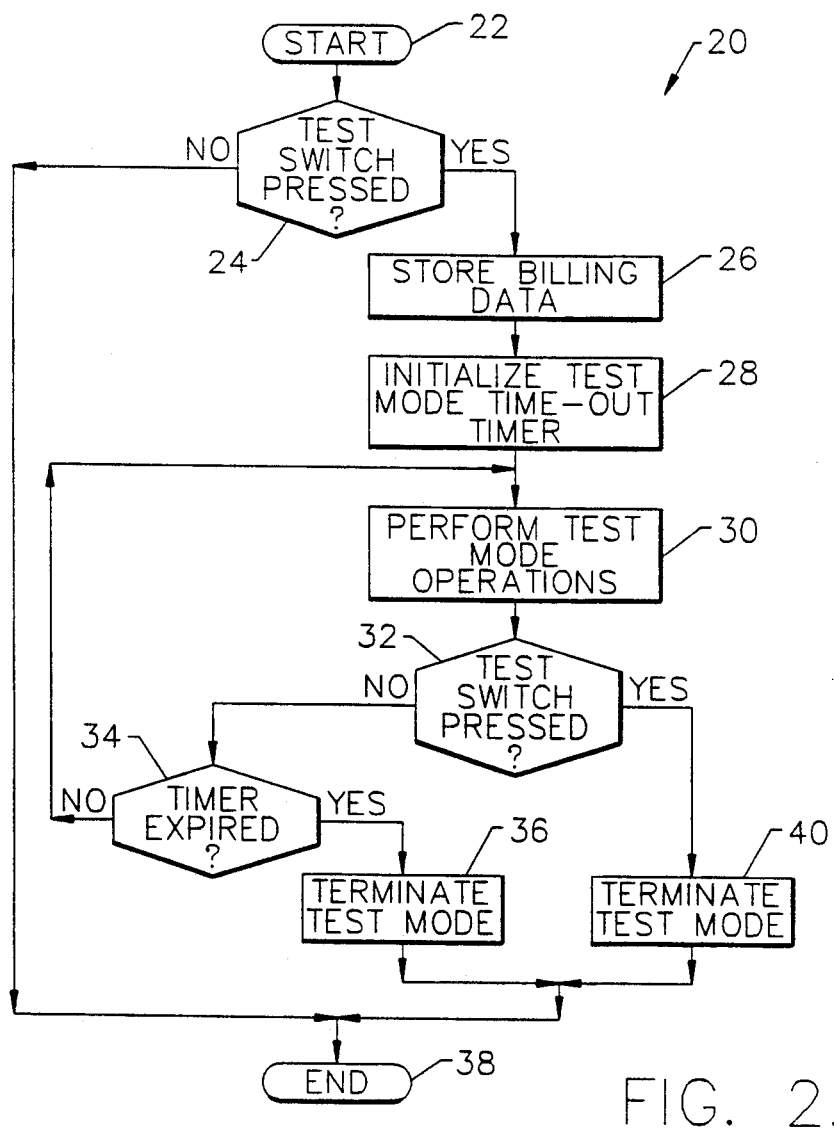
FIG. 2 is a flow chart illustrating a sequence of process steps in accordance with one embodiment of the present invention.

FIG. 2 is a flow chart 20 illustrating operations of the embodiment of the present invention shown in FIG. 1. More particularly, subsequent to starting operations as indicated by a START legend 22, it is determined whether the test switch has been pressed as indicated at step 24. If the test switch has been depressed, then billing data is stored as indicated at 26 and the test mode time-out timer is initiated as indicated at 28. The test mode operations are then performed as indicated at 30. While the test mode operations are being performed, the test switch is monitored to check whether the test switch has been pressed as indicated at step 32. If the test switch has not been pressed, and if the timer has not expired as indicated at 34, then test mode operations continue. If the timer has expired, however, then test mode operations are terminated as indicated at step 36. Operations then end as indicated at an end legend 38. If the test mode switch is depressed (step 32), then test mode operations are terminated as indicated at step 40. Operations then end as indicated at 38.

Figure 3:
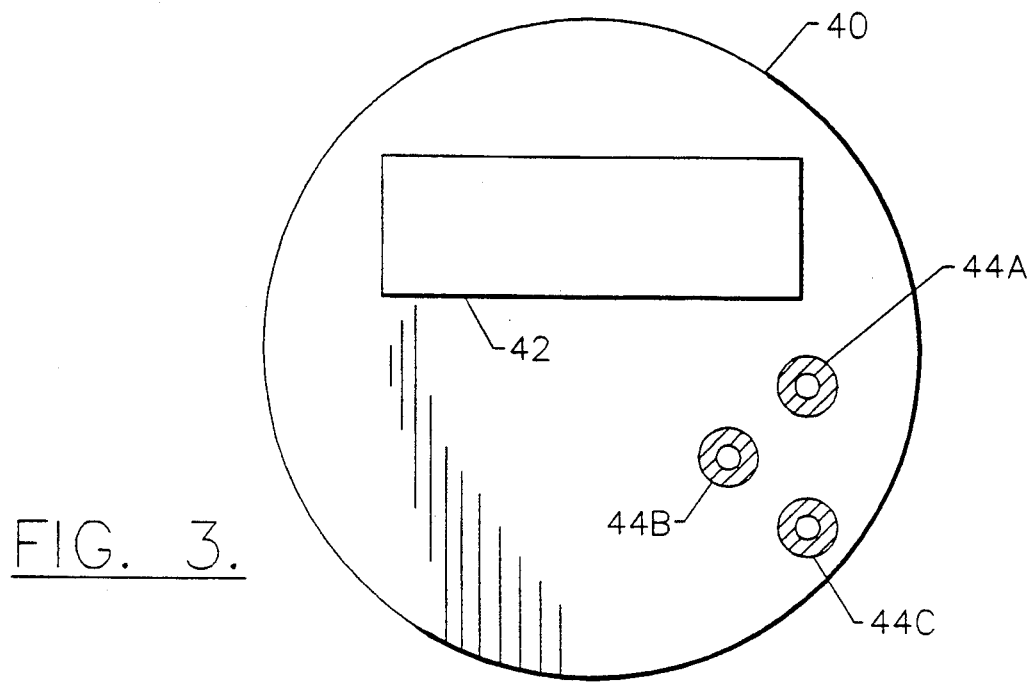
FIG. 3 is a front view of a meter bezel.

FIG. 3 is a front view of a meter bezel 40. Mounted to the bezel 40 is a register display 42, such as a liquid crystal display (LCD), and three switches 44 A–C. The switch 44A is a reset switch, the switch 44B is the display switch, and the switch 44C is the test switch. Such a meter bezel is well-known in the art and commercially available, for example, from General Electric Company, Meter & Control Business Department, Somersworth, N.H.

Figure 4:
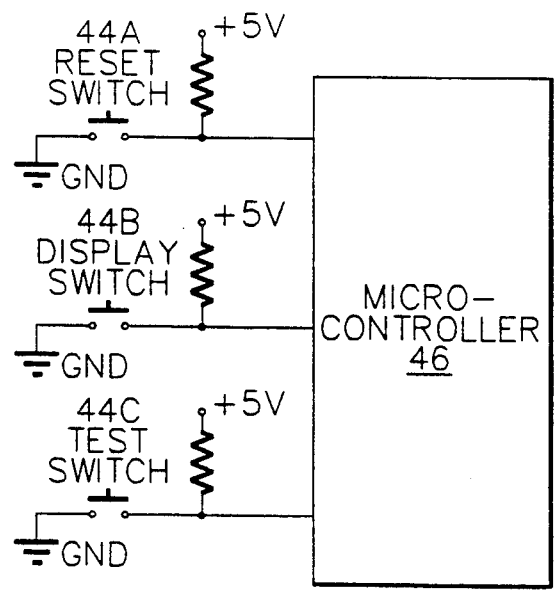
FIG. 4 is a block diagram illustration of the interconnection between the switches shown in FIG. 1 and the meter register micro-controller.

As illustrated in FIG. 4, each switch 44 A–C is coupled to a register micro-controller 46. The switches 44 A–C, as shown, are biased open. Through a reference voltage (e.g., +5 V) and a resistor (R1–R3) network, when one of the switches 44 A–C is depressed, the micro-controller 46 receives a +5 V pulse input on a corresponding input pin. When the test switch 44C is depressed, the micro-controller 46 performs operations in accordance with the present invention.

Appendix A is a pseudo code explanation of the present method for automatic return from test mode.

While the present invention has been described with respect to specific embodiments, many modifications, variations, substitutions, and equivalents will be apparent to those skilled in the art. Accordingly, the invention is to be considered as limited only by the spirit and scope of the appended claims.

APPENDIX A
COPYRIGHT (C) 1990 GENERAL ELECTRIC COMPANY

```
PERFORM test_mode_initialization_task( )
    . . .
    . . .
    initialize test_mode_timeout_timer to programmed value
    . . .
    . . .
END test_mode_initialization_task
PERFORM active_test_mode( )
    . . .
    . . .
    IF test switch is pressed
        perform terminate_test_mode( )
    ELSE
        IF get_current_operation_system_mode <> FAIL_SAFE_TEST_MODE
            IF test_mode_timeout_timer = 0
                perform terminate_test_mode( )
            ENDIF
        ENDIF
    ENDIF
END active_test_mode
```

What is claimed is:

1. A meter for measuring electrical energy, comprising:
   means electrically connected to a load for metering a quantity of electrical energy consumed by the load;
   register means, operatively connected to said electrical energy metering means, for recording and displaying customer billing data based on the quantity of electrical energy consumed by the load;
   means responsive to user actuation for storing said customer billing data in said register means and for converting said meter from a customer billing data recording and displaying mode of operation to a test mode of operation;
   means, responsive to said storing and converting means, for computing an elapsed time during which said meter is in said test mode of operation; and
   means, responsive to said elapsed time computing means for retrieving said customer billing data from storage and for converting said meter from said test mode of operation to said customer billing data recording and displaying mode of operation, when said elapsed time equals a predetermined elapsed time.

2. The meter of claim 1, wherein said register means comprises a solid-state microcontroller and liquid crystal register display electrically connected thereto, and wherein said storing and converting means comprises a switch on said register display.

3. The meter of claim 1, wherein said register means comprises a solid-state microcontroller and liquid crystal register display electrically connected thereto, and wherein said display comprises an optical port for accessing said storing and converting means.

4. The meter of claim 1, further comprising means responsive to user actuation for retrieving said customer billing data from storage and for converting said meter from said test mode of operation to said customer billing data recording and displaying mode of operation, irrespective of said elapsed time.

5. The meter of claim 4, wherein said register means comprises a solid-state microcontroller and liquid crystal register display electrically connected thereto, and wherein said storing and converting means comprises a switch on said register display.

6. The meter of claim 4, wherein said register means comprises a solid-state microcontroller and liquid crystal register display electrically connected thereto, and wherein said display comprises an optical port for accessing said storing and converting means.

7. The meter of claim 4, further comprising means responsive to user actuation for programming said predetermined elapsed time in said register means.

8. In a meter for measuring electrical energy, including means electrically connected to a load for metering a quantity of electrical energy consumed by the load and register means, for recording and displaying customer billing data based on the quantity of electrical energy consumed by the load, a method for automatically returning said register means for a test mode of operation comprising the steps of:
   storing said customer billing data in said register means in response to user actuation;
   converting said meter from a customer billing data recording and displaying mode of operation to a test mode of operation in response to user actuation;

computing an elapsed time, beginning at the commencement of said meter converting step; and automatically retrieving said customer billing data from said register means and terminating said test mode of operation when said elapsed time equals a predetermined elapsed time.

9. The method of claim 8, wherein said computing step is preceded by the step of programming a predetermined elapsed time into said register means and wherein said automatically retrieving step comprises the step of automatically retrieving said customer billing data from said register means and terminating said test mode of operation when said elapsed time equals said predetermined elapsed time.

10. The method of claim 9, wherein said storing step is preceded by the step of accessing an optical port on said meter.

11. The method of claim 9, wherein said automatically retrieving and terminating state terminates said test mode of operation when said elapsed time equals a predetermined elapsed time, notwithstanding that tests performed during said test mode of operation are incomplete.

* * * * *